US007017794B2

(12) United States Patent
Nosaka

(10) Patent No.: US 7,017,794 B2
(45) Date of Patent: Mar. 28, 2006

(54) WIRE BONDING METHOD AND WIRE BONDING APPARATUS

(75) Inventor: Hitoshi Nosaka, Tauruoka (JP)

(73) Assignee: Seiko Epson Corporation, (JP)

( * ) Notice: Subject to any disclaimer, the term of this patent is extended or adjusted under 35 U.S.C. 154(b) by 103 days.

(21) Appl. No.: 10/756,845

(22) Filed: Jan. 13, 2004

(65) Prior Publication Data

US 2004/0188499 A1 Sep. 30, 2004

(30) Foreign Application Priority Data

Jan. 14, 2003 (JP) ............................ 2003-005966

(51) Int. Cl.
*B23K 31/02* (2006.01)

(52) U.S. Cl. .................................... 228/180.5; 228/4.5

(58) Field of Classification Search ................ 228/1.1, 228/4.5, 51, 55, 110.1, 180.5
See application file for complete search history.

(56) References Cited

U.S. PATENT DOCUMENTS 4,230,925 A * 10/1980 Lascelles .................. 219/56.1
6,457,627 B1 * 10/2002 Komiyama ................ 228/4.5

FOREIGN PATENT DOCUMENTS

| | | | |
|---|---|---|---|
| JP | 3-127844 | * | 5/1991 |
| JP | 2001-7145 | | 1/2001 |
| JP | 2002164379 | * | 7/2002 |

OTHER PUBLICATIONS

Communication from Chinese Patent Office regarding related application.

* cited by examiner

*Primary Examiner*—Kevin Kerns
*Assistant Examiner*—Michael Aboagye
(74) *Attorney, Agent, or Firm*—Harness, Dickey & Pierce, P.L.C.

(57) ABSTRACT

A highly reliable bonding process is provided. The wire bonding method includes: (a) bonding a tip portion of a wire to a first electrode by pressing an open end section of a first hole of a first tool against the tip portion of the wire that is passed through the first hole and protrudes outside the first hole, and (b) bonding a part of a section of the wire that is lead out from the first electrode to a second electrode. The first tool is passed through a second hole of a second tool. The width of an open end section of the second hole is formed greater than the width of the open end section of the first hole. The step (b) is conducted by pressing the open end section of the second hole against the part of the wire.

11 Claims, 5 Drawing Sheets

WIRE BONDING METHOD AND WIRE BONDING APPARATUS

CROSS-REFERENCE TO RELATED APPLICATIONS

The present application claims priority to Japanese Patent Application No. 2003-005966 filed Jan. 14, 2003 which is incorporated by reference in its entirety.

BACKGROUND OF THE INVENTION

1. Technical Field

The present invention relates to a wire bonding method and a wire bonding apparatus.

2. Related Art

In a wire bonding process that is conducted in the manufacturing of semiconductor devices, pads of a semiconductor chip and leads of a package are connected with wires. In this process, tip portions of the wires that are lead outside from ends of capillaries are bonded to pads, the wires are lead out from the pads, and parts thereof are bonded to the leads. Recently, due to further miniaturization and higher integration of semiconductor devices, pads of semiconductor chips have become finer and the pitch thereof has become narrower. In an attempt to prevent the wires from contacting one another, the tip portion of each capillary is made to have a smaller diameter.

However, as the reduction of the diameter of the tip portion of each capillary advances, the tip portions of the capillaries and the wires have reduced contact areas when the wires are bonded to the leads (in second bonding), such that the wires may not be sufficiently bonded to the leads, which occasionally caused bonding failures.

It is an object of the present invention to conduct highly reliable wire bonding.

SUMMARY

A wire bonding method in accordance with the present invention comprises: (a) bonding a tip portion of a wire to a first electrode by pressing an open end section of a first hole of a first tool against the tip portion of the wire that is passed through the first hole and protrudes outside the first hole; and (b) bonding a part of a section of the wire that is lead out from the first electrode to a second electrode, wherein the first tool is passed through a second hole of a second tool, the width of an open end section of the second hole is formed greater than the width of the open end section of the first hole, and the step (b) is conducted by pressing the open end section of the second hole against the part of the wire.

In accordance with the present invention, the tip portion of the wire is bonded to the first electrode by the first tool, and a portion of a section of the wire that is lead out from the first electrode is bonded to the second electrode by the second tool. The width of the open end section of the second hole is made greater than the width of the open end section of the first hole. Accordingly, the pressing area of the wire can be sufficiently secured, and the wire can be securely bonded to the second electrode, such that bonding failures can be eliminated.

A wire bonding method in accordance with the present invention comprises: (a) bonding a tip portion of a wire to a first electrode by pressing an open end section of a first hole of a first tool against the tip portion of the wire that is passed through the first hole and protrudes outside the first hole; and (b) bonding a part of a section of the wire that is lead out from the first electrode to a second electrode, wherein the first tool is passed through a second hole of a second tool, and the step (b) is conducted by pressing the open end section of the first hole and an open end section of the second hole against the part of the wire. In accordance with the present invention, a tip portion of the wire is bonded to the first electrode by the first tool, and a part of a section of the wire that is lead out from the first electrode is bonded to the second electrode by the first and second tools.

Accordingly, the pressing area of the wire can be sufficiently secured, and the wire can be securely bonded to the second electrode, such that bonding failures can be eliminated.

The present wire bonding method may further include (c) cutting the wire, after the step (b).

In the present wire bonding method, the wire may be cut adjacent to the open end section of the second hole in the step (c).

In the present wire bonding method, the step (c) may be conducted in a state in which the open end section of the first hole is disposed above the open end section of the second hole, and the wire is lead out from the first hole to reach an area adjacent to the open end section of the second hole. Accordingly, as the cutting step is conducted in a state in which the wire protrudes outside the first hole, the operation to feed the tip portion of the wire outside the first hole can be eliminated.

In the present wire bonding method, the open end section of the second hole may be provided with a gradually narrowing taper. With this configuration, the wire can be readily cut adjacent to the open end section of the second hole.

In the present wire bonding method, in the step (c), the wire may be cut adjacent to the open end section of the first hole.

The present wire bonding method may further include the step of, after the step (c), feeding out the wire such that the tip portion of the wire protrudes outside the first hole.

In the present wire bonding method, the open end section of the first hole and the open end section of the second hole may define a continuous plane surface when they are arranged to have the same height. As a result, the pressing area of the wire can be sufficiently secured.

In the present wire bonding method, the first electrode may be a pad of a semiconductor chip, and the second electrode may be a lead of a package of a semiconductor device.

A wire bonding apparatus in accordance with the present invention comprises first and second tools for bonding a wire to first and second electrodes, wherein the first tool includes a first hole through which the wire is passed and an open end section of the first hole that is pressed against a tip portion of the wire that protrudes outside the first hole; and the second tool includes a second hole through which the first tool is passed and an open end section of the second hole that is pressed against a part of a section of the wire that is led out from the first electrode, wherein the width of the open end section of the second hole is greater than the width of the open end section of the first hole. In accordance with the present invention, the width of the open end section of the second hole of the second tool is greater than the width of the open end section of the first hole of the first tool. Accordingly, the pressing area of the wire can be sufficiently secured, and the wire can be securely bonded to the second electrode, such that bonding failures can be eliminated.

A wire bonding apparatus in accordance with the present invention comprises first and second tools for bonding a wire to first and second electrodes, wherein the first tool includes a first hole through which the wire is passed and an open end section of the first hole that is pressed against a tip portion of the wire that protrudes outside the first hole, the second tool includes a second hole through which the first tool is passed and an open end section of the second hole, and the open end section of the first hole and the open end section of the second hole are pressed against a part of a section of the wire that is lead out from the first electrode. In accordance with the present invention, the open end section of the first hole and the open end section of the second hole are pressed against a portion of a section of the wire that is lead out from the first electrode. Accordingly, the pressing area of the wire can be sufficiently secured, and the wire can be securely bonded to the second electrode, such that bonding failures can be eliminated.

DETAILED DESCRIPTION

Figure 1:
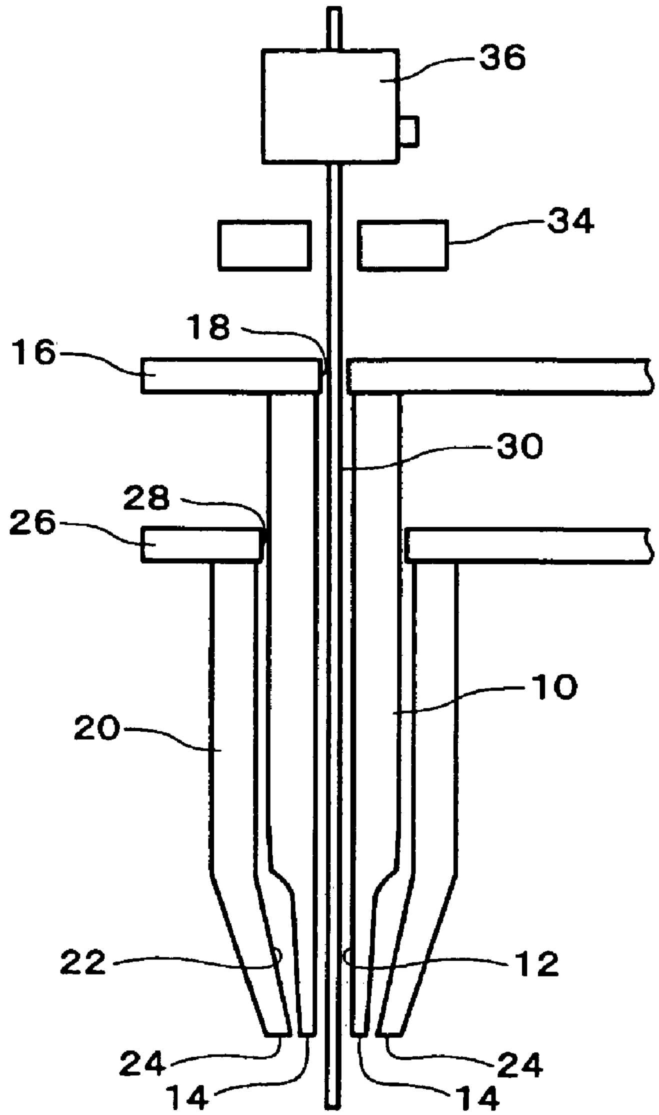
FIG. 1 is a diagram for describing a wire bonding apparatus in accordance with an embodiment of the present invention.
Figure 2:
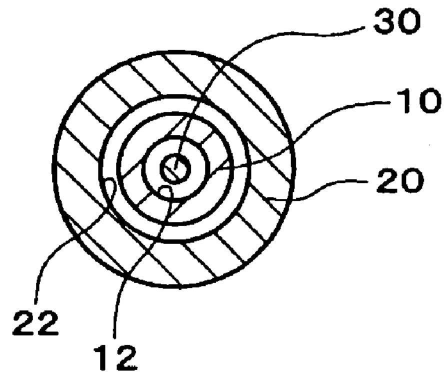
FIG. 2 is a diagram for describing the wire bonding apparatus in accordance with the embodiment of the present invention.

Hereafter, an embodiment of the present invention will be described with reference to the drawings. FIG. 1 and FIG. 2 are diagrams for describing a wire bonding apparatus in accordance with an embodiment of the present invention. When manufacturing a semiconductor device, the wire bonding apparatus functions as an apparatus that manufactures the semiconductor device. The wire bonding apparatus is used for conducting a ball bonding (or nail head bonding) process.

The wire bonding apparatus includes first and second tools (for example, first and second capillaries) 10 and 20. For example, the wire bonding apparatus includes a work piece (for example, a semiconductor device) supply section, a transfer section and storage section, a bonding head section, and a table on which the bonding head section is mounted. The first and second tools 10 and 20 are attached to holders (supporting members 16 and 26) of the bonding head section, and can be moved in three dimensions by operatively controlling the table and the holder.

As indicated in FIG. 1, the first tool 10 defines a first hole (for example, a round hole) 12 through which a wire 30 is passed. The first hole 12 defines a guide section for the wire 30. As indicated in a lateral cross-sectional view of FIG. 2, the first hole 12 may be a closed hole. The diameter (or width) of the first hole 12 is greater than the diameter of the wire 30, such that the wire 30 can pass into the inside of the first hole 12.

An open end section 14 of the first hole 12 on the side of the work piece defines a portion that presses the wire 30. More specifically, the open end section 14 of the first hole 12 is pressed against a tip portion 32 (for example, a ball section) of the wire 30 that protrudes outside the first hole 12 (see FIG. 4). The open end section 14 of the first hole 12 is used in a so-called first bonding process. The open end section 14 of the first hole 12 has a predetermined width, and is formed in a ring shape (for example, in a circular ring shape).

The first tool 10 is supported by the supporting member 16. When ultrasonic vibration is added to the first tool 10, the supporting member 16 defines an ultrasonic horn that magnifies and transmits the ultrasonic vibration. The supporting member 16 is provided with a hole 18 that continues to the first hole 12 of the first tool 10, and the wire 30 passes through the hole 18. In the example shown in FIG. 1, a tip portion (an end portion on the side of the work piece) of the first tool 10 is narrower than its base portion (an end portion on the side of the supporting member 18). In other words, the tip portion of the first tool 12 has a smaller diameter (or width) than the base portion. The first tool 10 may be a bottle neck type tool. As a result, contacts in the lateral direction (for example, with adjacent wires) can be prevented when the first tool 10 is brought closer to the work piece.

As indicated in FIG. 1, the second tool 20 includes a second hole (for example, a circular hole) 22 through which the first tool 10 is passed. In other words, the first and second tools 10 and 20 have a dual structure in which the first tool 10 can be superposed on the inside of the second tool 20. The second hole 22 defines a guide section for the wire 30 and the first tool 10. As indicated in FIG. 2, the second hole 22 may be a closed hole. The diameter (or the width) of the second tool 20 is greater than the diameter (or the width) of the first tool 10, and at least a part of the first tool 10 can protrude outside the second hole 22. It is noted that the total length (the length in the height direction) of the first tool 10 is greater than the total length of the second tool 20.

An open end section 24 of the second hole 22 on the side of the work piece defines a portion that presses the wire 30. More specifically, the open end section 24 of the second hole 22 is pressed against a part of a section of the wire 30 that is lead out in the lateral direction outside of the second hole 22 (see FIG. 5). The open end section 24 of the second hole 22 is used in a so-called second bonding process. The open end section 24 of the second hole 22 has a predetermined width and is formed in a ring shape (for example, in a circular ring shape). In the present embodiment, the width of the open end section 24 of the second hole 22 is greater than the width of the open end section 14 of the first hole 12.

The second tool 20 is supported by the supporting member 26. The supporting member 26 may be an ultrasonic horn like the one described above. The supporting member 26 is provided with a hole 28 that connects to the second hole 22 of the second tool 20, and the first tool 10 is inserted in the hole 28. As indicated in FIG. 1, a tip portion (an end portion on the side of the work piece) of the second tool 20 may be narrower than its base portion (a base portion thereof on the side of the supporting member 28).

As indicated in FIG. 1, the wire bonding apparatus includes a clamper 34 and an air tension device 36. The damper 34 is provided above the first and second tools 10 and 20 to grab or release the wire 30 in order to retain or feed the wire 30. The air tension device 36 is provided above the clamper 34 to provide a tension to the wire 30 in order to stabilize the loop and bonding of the wire 30.

FIGS. 3 through 7 are diagrams for describing a wire bonding method in accordance with an embodiment of the present invention. FIG. 8 is a diagram for describing its modified example. The wire bonding method in accordance with the present embodiment is conducted, using the wire bonding apparatus described above. As indicated in the example of the present embodiment, a semiconductor device can be manufactured by adopting the wire bonding method in accordance with the present embodiment, when the Wires 30 are bonded to pads (first electrodes 40) of a semiconductor chip 44.

First, a work piece having first and second electrodes 40 and 42 is prepared. In the example indicated in FIG. 3, the work piece is a semiconductor device. For example, a semiconductor chip 44 having first electrodes 40 and a substrate 46 having second electrodes 42 are prepared.

The semiconductor chip 44 includes an integrated circuit formed on a semiconductor substrate. Alternatively, an integrated circuit chip in which an integrated circuit is formed on a substrate (not limited to a semiconductor substrate) may be prepared. In this case, the work piece is an integrated circuit device. The first electrode 40 may be a pad (for example, an aluminum pad) that is formed on the surface of the semiconductor chip 44. A plurality of pads may be formed thereon, and the plurality of pads may be arranged along at least one side (or two opposing sides or four sides) of the semiconductor chip 44. A passivation film ($SiO_2$, SiN or polyimide resin) is formed over the surface of the semiconductor chip 44 in a manner to avoid the pads.

The substrate 46 is a wiring substrate on which leads (wirings) are formed. The substrate 46 defines a package of the semiconductor device, and is called an interposer. Alternatively, instead of the substrate, a lead frame may be prepared. Plural leads are supported on the lead frame and, for example, the wires 30 are bonded to inner leads (second electrodes). The second electrodes 42 may be leads that are formed on a surface of the substrate 46. More specifically, the leads include terminal sections (for example, lands in the case of the substrate 46), and the terminal sections of the leads define the second electrodes 42. The terminal sections of the leads are disposed around the semiconductor chip 44.

Figure 3:
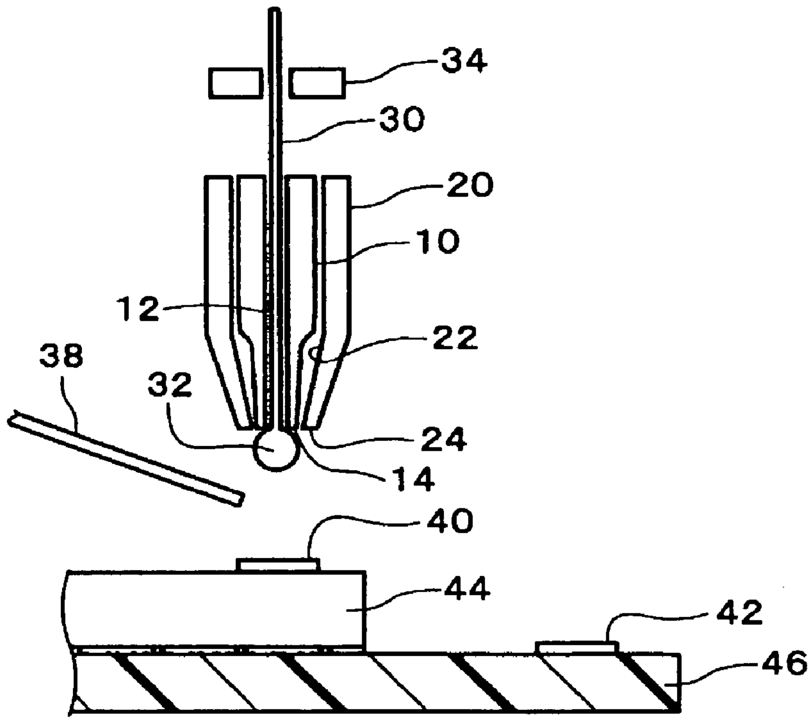
FIG. 3 is a diagram for describing a wire bonding method in accordance with an embodiment of the present invention.

As indicated in FIG. 3, the wire 30 is disposed on the side of a face of the semiconductor chip 44 where the first electrode 40 is formed. The wire 30 is disposed in a manner that it stands generally perpendicular to the surface of the semiconductor chip 44. Then, the tip portion 32 of the wire 30, which protrudes outside the first hole 12, is processed into a ball shape. For example, a torch 38 is brought closer to cause a high voltage discharge to melt the tip portion 32 of the wire 30. The diameter of the tip portion 32 becomes greater than the diameter of the first hole 12. The tip portion 32 of the wire 30 is processed outside the second hole 22. In other words, the tip portion (the open end section 14 of the first hole 12) of the first tool 10 may protrude outside the second hole 22 of the second tool 20, or as indicated in FIG. 3, may be disposed at the same height of the tip portion of the second tool 20.

Figure 4:
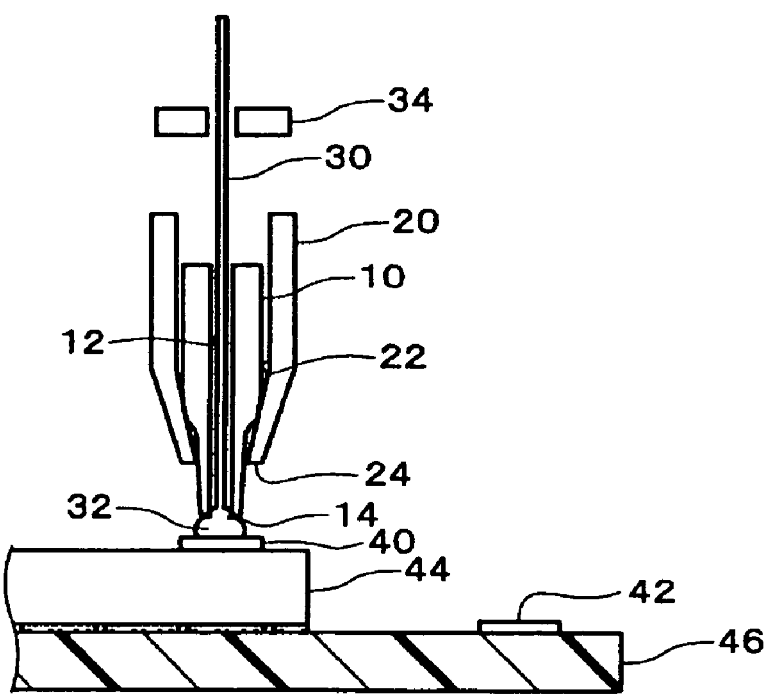
FIG. 4 is a diagram for describing the wire bonding method in accordance with the embodiment of the present invention.

As indicated in FIG. 4, the first tool 10 is lowered such that the open end section 14 of the first hole 12 is pressed against the tip portion 32 of the wire 30. The tip portion of the first tool 10 protrudes outside the second hole 22 of the second tool 20. While the tip portion 32 of the wire 30 is pressed under a predetermined pressure to be attached under pressure to the first electrode 40, ultrasonic vibration or heat is added. In this manner, the tip portion 32 of the wire 30 is bonded to the first electrode 40. In this bonding process, only the first tool 10 of the smaller diameter is brought closer to the first electrode 40, and the second tool 20 of the larger diameter stands by above, such that contacts thereof to adjacent wires that have already been bonded can be avoided.

Figure 5:
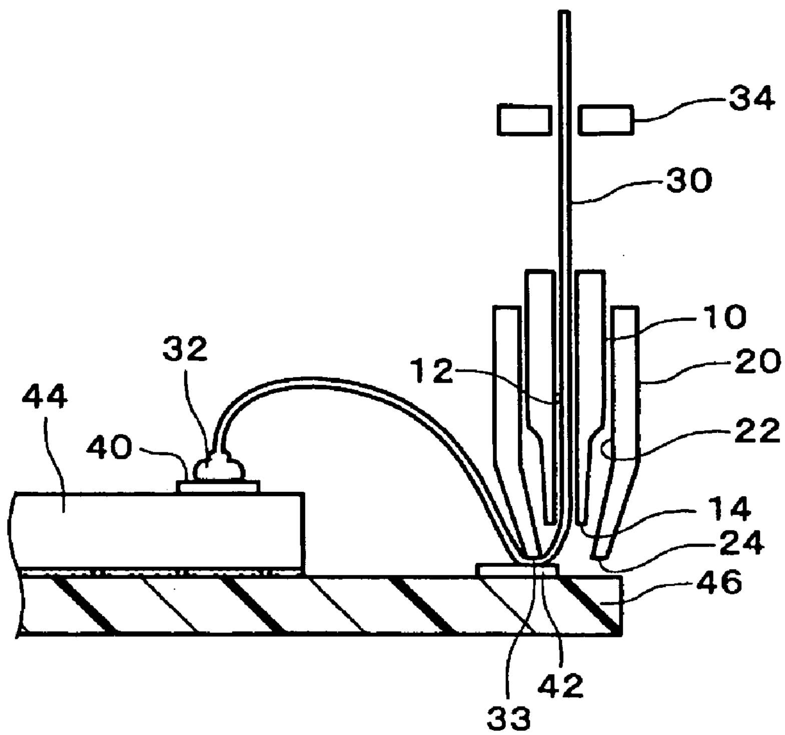
FIG. 5 is a diagram for describing the wire bonding method in accordance with the embodiment of the present invention.
Figure 6:
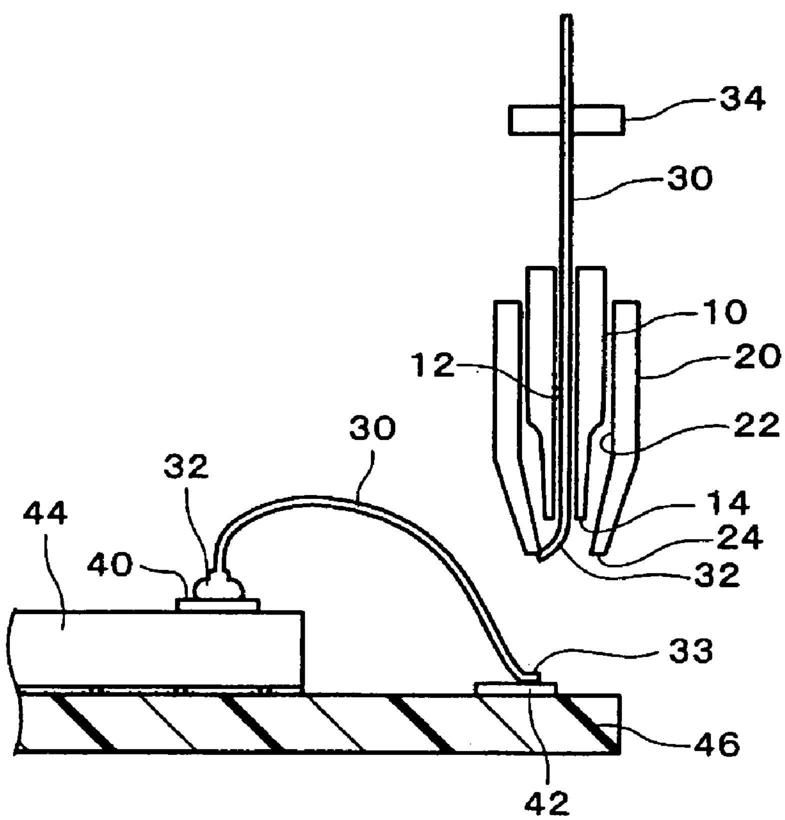
FIG. 6 is a diagram for describing the wire bonding method in accordance with the embodiment of the present invention.

As indicated in FIG. 5, the wire 30, while its tip portion 32 is connected to the first electrode 40, is drawn out in the direction toward the second electrode 42. For example, in a state in which the tip portion of the first tool 10 is protruded outside the second hole 22, the first and second tools 10 and 20 are moved, to thereby form the wire 30 into a loop shape. Then, the wire 30 is disposed above the second electrode 42, the second tool 40 is lowered, and the open end section 24 of the second hole 22 is pressed against a predetermined portion 33 of the wire 30. The first tool 10 is disposed within the second hole 22. In this case also, while the predetermined portion 33 of the wire 30 is attached under pressure to the second electrode 42, ultrasonic vibration or heat is added. In this manner, the wire 30 is bonded to the second electrode 42. In this bonding process, since the open end section 24 of the second hole 22 of the greater diameter is used, a crescent area (an area of the press-deformed portion) of the wire 30 can be made larger. As a result, the predetermined portion 33 of the wire 30 can therefore be securely pressure bonded to the second electrode 42.

Figure 7:
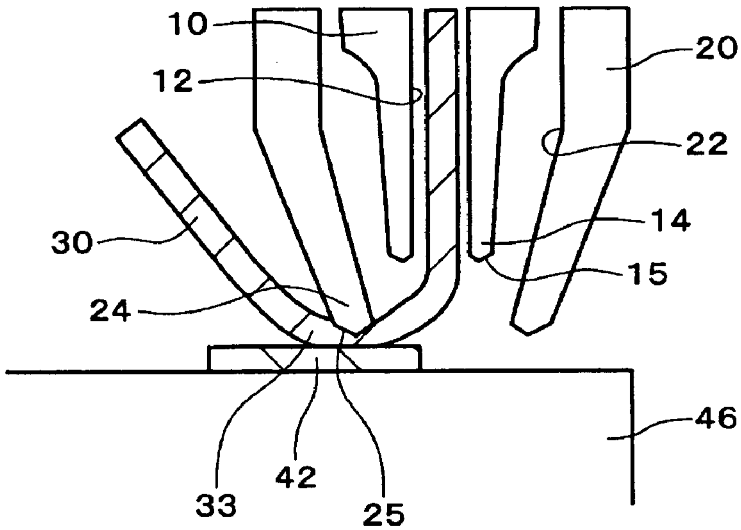
FIG. 7 is a diagram for describing the wire bonding method in accordance with the embodiment of the present invention.
Figure 8:
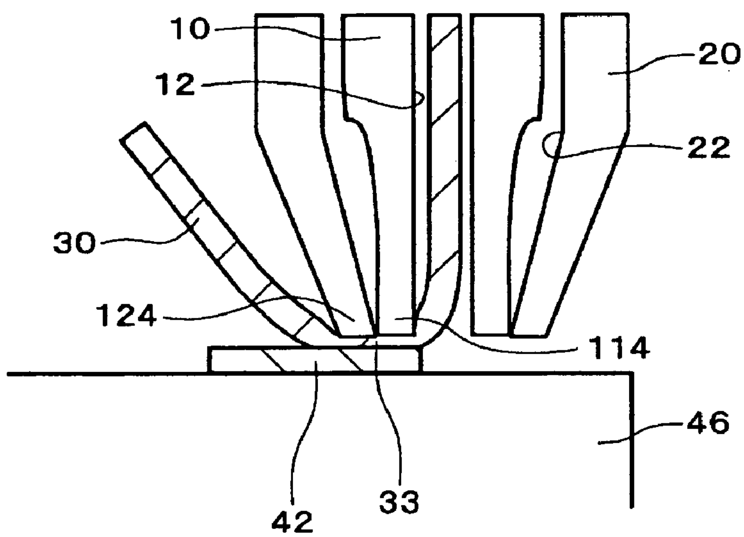
FIG. 8 is a diagram for describing a wire bonding method and a wire bonding apparatus in accordance with a modified example of the embodiment of the present invention.

FIG. 7 is a partially enlarged view in the process indicated in FIG. 5. As indicated in FIG. 7, the open end section 24 of the second hole 22 may be provided with a gradually narrowing taper 25. By so doing, the open end section 24 of the second hole 22 deeply cuts in the predetermined portion 33 of the wire 30, which makes the wire 30 to be readily sheared off in an area adjacent to the open end section 24 of the second hole 22 in a cutting process to be later conducted. In other words, the cutting position of the wire 30 stabilizes. It is noted that the open end section 14 of the first hole 12 of the first tool 10 may also be provided with a gradually narrowing taper 15.

Next, the wire 30 is cut. In the example indicated in FIG. 6, the wire 30 is cut in an area adjacent to the open end section 24 of the second hole 22. First, in a state in which the open end section 24 of the second hole 22 is pressed against the wire 30, the first tool 10 is raised, as indicated in. FIG. 5. Stated otherwise, the open end section 14 of the first hole 12 is disposed above the open end section 24 of the second hole 22. As a result, the wire 30 is pulled out such that it extends from the first hole 12 and reaches a point adjacent to the open end section 24 of the second hole 22. Then, the wire 30 is grabbed by the damper 34, and only the first tool 10 is further raised. In this manner, the wire 30 is sheared off adjacent the open end section 24 of the second hole 22 (for example, at an inner circumference of the open end section 24). Accordingly, since the cutting process is conducted in a state in which the wire 30 protrudes outside the first hole 12, an operation to feed the wire 30 out of the first hole 12 can be omitted.

Then, the tip portion 32 of the wire 30 that protrudes outside the first hole 12 is disposed outside the second hole 22, and processed into a ball shape, and the steps described above are repeated. When there are plural pairs of the first and second electrodes 40 and 42 to be bonded with wires, the steps described above are repeated for each of the pairs.

In accordance with the present embodiment, the tip portion 32 of the wire 30 is bonded to the first electrode 40 by the first tool 10, and a part of a section (the predetermined portion 33) of the wire 30 that is pulled out from the first electrode 40 is bonded to the second electrode 42 by the second tool 20. The width of the open end section 24 of the second hole 22 of the second tool. 20 is greater than the width of the open end section 14 of the first hole 12 of the first tool 10. As a result, a sufficient pressing area can be secured in the wire 30, the wire 30 can be securely bonded to the second electrode 42, and a bonding failure can be eliminated.

As indicated in a modified example in FIG. 8, both of an open end section 114 of the first hole 12 and an open end section 124 of the second hole 22 may be pressed against the predetermined portion 33 of the wire 30 to thereby bond the wire 30 to the second electrode 42. In this case, the open end section 114 of the first hole 12 and the open end section 124 of the second hole 22 may preferably be arranged generally at the same height to define a continuous plane surface. The open end section 114 of the first hole 12 and the open end section 124 of the second hole 22 have a plane surface, respectively. Also, as indicated in FIG. 8, a gap may preferably not be provided between the open end section 114 of the first hole 12 and the open end section 124 of the second hole 22. By this, a more ample pressing area of the wire 30 can be secured.

In accordance with the present modified example, in the process of cutting the wire 30, the wire 30 is cut in an area adjacent to the open end section 114 of the first hole 12. In other words, in a state in which both of the open end section 114 of the first hole 12 and the open end section 124 of the second hole 22 are pressed against the wire 30, the wire 30 is grabbed by the damper 34, and only the damper 34 is raised. In this manner, the wire 30 is sheared off in an area adjacent to the open end section 114 of the first hole 12 (for example, at an inner circumference of the open end section 114). Then, for conducting the succeeding bonding process, a process to feed the wire 30 outside of the first hole 12 is conducted. For example, by grabbing the wire 30 by the damper 34, and reducing the relative distance between the damper 34 and the first tool 10, the tip portion 32 of the wire 30 can protrude outside the first hole 12.

The present modified example can achieve effects similar to the effects described above. Also, a wire bonding apparatus in accordance with the present modified example is similar to the one described above, and therefore its description is omitted.

Figure 9:
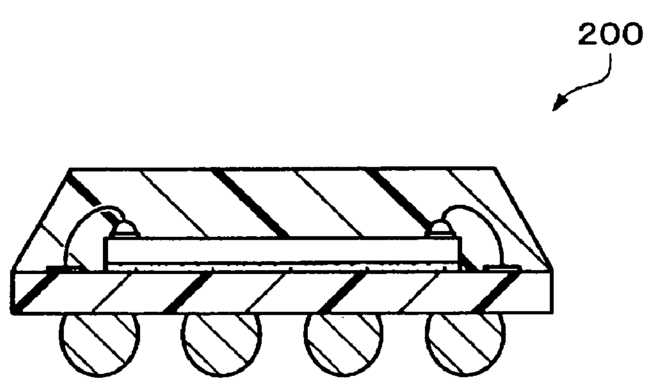
FIG. 9 is a diagram of a semiconductor device in accordance with an embodiment of the present invention.
Figure 10:
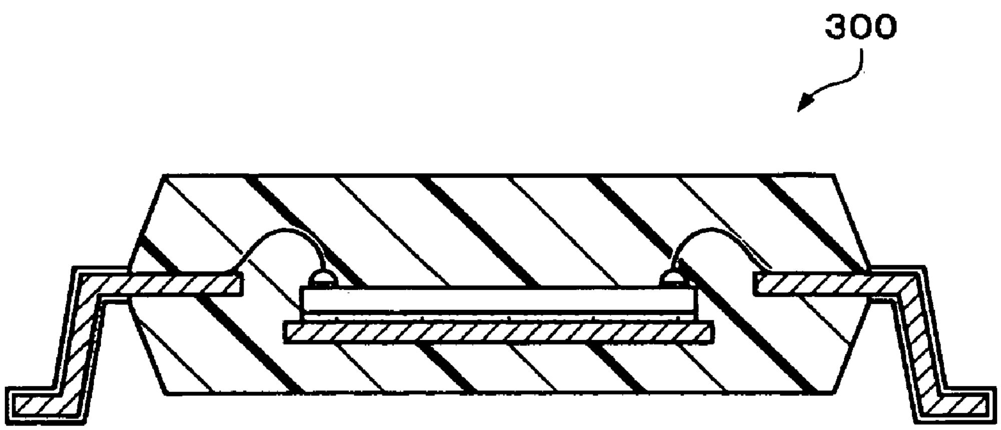
FIG. 10 is a diagram of a semiconductor device in accordance with an embodiment of the present invention.

As examples of semiconductor devices that are manufactured by applying the wire bonding method in accordance with the embodiment of the present invention, FIG. 9 shows a semiconductor device 200 of CSP (Chip Size/Scale Package) type, and FIG. 10 shows a semiconductor device 300 of QFP (Quad Flat Package) type. Their structures are known, and therefore descriptions thereof are omitted.

The present invention is not limited to the embodiments described above, and many modifications can be made. For example, the present invention may include compositions that are substantially the same as the compositions described in the embodiments (for example, a composition with the same function, method and result, or a composition with the same objects and result). Also, the present invention includes compositions in which portions not essential in the compositions described in the embodiments are replaced with others. Also, the present invention includes compositions that achieve the same functions and effects or achieve the same objects of those of the compositions described in the embodiments. Furthermore, the present invention includes compositions that include publicly known technology added to the compositions described in the embodiments.

What is claimed is:

1. A wire bonding method comprising:

(a) bonding a tip portion of a wire to a first electrode by pressing an open end section of a first hole of a first tool against the tip portion of the wire that is passed through the first hole and protrudes outside the first hole;

(b) bonding a part of a section of the wire that is led out from the first electrode to a second electrode; and (c) cutting the wire;

wherein the first tool is passed through a second hole of a second tool;

wherein a width of an open end section of the second hole is greater than a width of the open end section of the first hole;

wherein the step (b) is conducted by pressing the open end section of the second hole against the part of the wire;

wherein the wire is cut adjacent to the open end section of the second hole in the step (c); and wherein the step (c) is conducted in a state in which the open end section of the first hole is disposed above the open end section of the second hole, and the wire is led out from the first hole to reach an area adjacent to the open end section of the second hole.

2. A wire bonding method according to claim 1, wherein the open end section of the second hole is provided with a gradually narrowing taper.

3. A wire bonding method according to claim 1, wherein the first electrode is a pad of a semiconductor chip, and the second electrode is a lead of a package of a semiconductor device.

4. A wire bonding method comprising:

(a) bonding a tip portion of a wire to a first electrode by pressing an open end section of a first hole of a first tool against the tip portion of the wire that is passed through the first hole and protrudes outside the first hole;

(b) bonding a part of a section of the wire that is led out from the first electrode to a second electrode; and (c) cutting the wire;

wherein the first tool is passed through a second hole of a second tool;

wherein the step (b) is conducted by pressing the open end section of the first hole and an open end section of the second hole against the part of the wire;

wherein the wire is cut adjacent to the open end section of the second hole in the step (c); and wherein the step (c) is conducted in a state in which the open end section of the first hole is disposed above the open end section of the second hole, and the wire is led out from the first hole to reach an area adjacent to the open end section of the second hole.

5. A wire bonding method according to claim 4, further comprising (c) cutting the wire, after the step (b).

6. A wire bonding method according to claim 5, wherein the wire is cut adjacent to the open end section of the first hole in the step (c).

7. A wire bonding method according to claim 6, further comprising feeding out the wire such that the tip portion of the wire protrudes outside the first hole, after the step (c).

8. A wire bonding method according to claim 6, wherein the open end section of the first hole and the open end section of the second hole define a continuous plane surface when arranged to have an identical height.

9. A wire bonding method according to claim 4, wherein the first electrode is a pad of a semiconductor chip, and the second electrode is a lead of a package of a semiconductor device.

10. A wire bonding apparatus comprising:

first and second tools for bonding a wire to first and second electrodes, wherein the first tool includes a first hole through which the wire is passed, and an open end section of the first hole that is pressed against a tip portion of the wire that protrudes outside the first hole, and the second tool includes a second hole having a gradually narrowing taper through which the first tool is passed, and an open end section of the second hole that is pressed against a part of a section of the wire that is led out from the first electrode, wherein the width of the open end section of the second hole is greater than the width of the open end section of the first hole.

11. A wire bonding apparatus comprising:

first and second tools for bonding a wire to first and second electrodes, wherein the first tool includes a first hole through which the wire is passed, and an open end section of the first hole that is pressed against a tip portion of the wire that protrudes outside the first hole, and the second tool includes a second hole having a gradually narrowing taper through which the first tool is passed, and an open end section of the second hole, wherein the open end section of the first hole and the open end section of the second hole are pressed against a part of a section of the wire that is led out from the first electrode.

* * * * *